(12) United States Patent
Cho et al.

(10) Patent No.: US 9,143,145 B2
(45) Date of Patent: Sep. 22, 2015

(54) DELTA-SIGMA MODULATOR

(71) Applicant: Electronics and Telecommunications Research Institute, Daejeon (KR)

(72) Inventors: Young Kyun Cho, Daejeon (KR); Jae Ho Jung, Daejeon (KR); Kwangchun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/308,752

(22) Filed: Jun. 19, 2014

(65) Prior Publication Data

US 2015/0200678 A1 Jul. 16, 2015

(30) Foreign Application Priority Data

Jan. 13, 2014 (KR) .................. 10-2014-0004103

(51) Int. Cl.
| | | |
|---|---|---|
| *H03M 3/00* | (2006.01) | |
| *H03M 1/00* | (2006.01) | |
| *H03M 1/12* | (2006.01) | |

(52) U.S. Cl.
CPC .............. *H03M 1/002* (2013.01); *H03M 3/404* (2013.01); *H03M 3/454* (2013.01); *H03M 1/00* (2013.01); *H03M 1/12* (2013.01); *H03M 3/30* (2013.01)

(58) Field of Classification Search
CPC ............. H03M 3/30; H03M 1/12; H03M 1/00
USPC .......... 341/143, 155, 110, 120, 136; 327/105; 375/219
See application file for complete search history.

(56) References Cited

U.S. PATENT DOCUMENTS

| | | |
|---|---|---|
| 5,243,345 A | 9/1993 | Naus et al. |
| 7,961,128 B2 | 6/2011 | Kim et al. |
| 8,258,990 B2 | 9/2012 | Dosho et al. |
| 2006/0022861 A1* | 2/2006 | Kudoh et al. ................. 341/155 |

OTHER PUBLICATIONS

Kuang, Wensheng V., "A Novel Biquad Filter Circuit for Continuous-Time Sigma-Delta Modulators," IEEE. (2006) 4 Pages.
Zanbaghi, Ramin, et al. "A Novel Low Power Hybrid Loop Filter for Continuous-Time Sigma-Delta Modulators." Circuits and Systems, IEEE International Symposium on. IEEE, 2009. pp. 3114-3117.
Matsukawa, Kazuo, et al. "A 10 MHz BW 50 fJ/conv. Continuous Time ΔΣ Modulator with High-order Single Opamp Integrator using Optimization-based Design Method." VLSI Circuits (VLSIC), 2012 Symposium on. IEEE, pp. 160-161.
Zanbaghi, Ramin, et al. "An 80-dB DR, 7.2-MHz Bandwidth Single Opamp Biquad Based CT ΔΣ Modulator Dissipating 13.7-mW." Solid-State Circuits, IEEE Journal of 48.2 (2013): pp. 487-501.

* cited by examiner

*Primary Examiner* — Joseph Lauture
(74) *Attorney, Agent, or Firm* — NSIP Law

(57) ABSTRACT

Provided is a delta-sigma modulator including a summer summing an input signal and an analog signal, a first integrator integrating an output signal from the summer and outputting a first integration signal, a second integrator integrating the first integration signal and outputting a second integration signal, a comparator comparing the second integration signal and a reference signal and outputting a digital signal according to the comparison result, and a digital-to-analog converter converting the digital signal into an analog signal in response to a clock signal and outputting the converted analog signal, wherein the second integrator operates based on an Nth order (where N is natural number of 1 or greater) transfer function.

9 Claims, 5 Drawing Sheets

DELTA-SIGMA MODULATOR

CROSS-REFERENCE TO RELATED APPLICATIONS

This U.S. non-provisional patent application claims priority under 35 U.S.C. §119 of Korean Patent Application No. 10-2014-0004103, filed on Jan. 13, 2014, the entire contents of which are hereby incorporated by reference.

BACKGROUND OF THE INVENTION

The present invention disclosed herein relates to a delta-sigma modulator, and more particularly, to a delta-sigma modulator having a continuous-time structure.

A delta-sigma modulator may be implemented in a discrete-time scheme or a continuous-time scheme. A delta-sigma modulator according to the discrete-time scheme stores and delivers an input signal in a charge type on the basis of a switched-capacitor scheme. While the discrete-time delta-sigma modulator operates according to a sampling process for an input signal, the continuous-time delta-sigma modulator may operate without a sampling process for an input signal.

Compared to the discrete-time scheme, the continuous-time scheme has a low requirement for a design of an amplifier used for an integrator and may operate in low power and high speed. When the integrator does not perform a sampling operation, the continuous-time delta-sigma modulator has an anti-aliasing filter effect.

According to characteristics of a high signal to noise ratio (SNR), the continuous-time delta-sigma modulator may be used for a wireless communication system, such as a 3rd generation partnership project (3GPP), long term evolution (LTE), and worldwide interoperability for microwave access (WiMAX).

In addition, delta-sigma modulators having an identical sampling frequency may use a scheme for increasing an order and output level for enhancing the SNR characteristics. For example, when an order of the delta-sigma modulator is increased to a 1st, 2nd, and 3rd-order, slopes of a noise transfer function (NTF) of the delta-sigma modulator are respectively increased to 20 dB/dec, 40 dB/dec. 60 dB/dec. Accordingly, a noise amount within a signal band may be reduced and SNR characteristics may be increased.

However, when an order of the delta-sigma modulator for increasing an SNR is increased, the number of integrators is also necessary to be increased according to the increase of the order. However, power consumption is also increased along with the increase of the number of integrators, and the number of digital-to-analog converters (DACs) connected back to the integrators is also increased. Accordingly, a circuit of the delta-sigma modulator becomes complex.

SUMMARY OF THE INVENTION

The present invention provides a delta-modulator of which power consumption can be lowered despite of an increase of an order.

Embodiments of the present invention provide delta-sigma modulators including: a summer summing an input signal and an analog signal; a first integrator integrating an output signal from the summer and outputting a first integration signal; a second integrator integrating the first integration signal and outputting a second integration signal; a comparator comparing the second integration signal and a reference signal and outputting a digital signal according to the comparison result; and a digital-to-analog converter converting the digital signal into an analog signal in response to a clock signal and outputting the converted analog signal, wherein the second integrator operates based on an Nth order (where N is natural number of 1 or greater) transfer function.

In other embodiments of the present invention, delta-sigma modulators include: a summer summing an input signal and an analog signal; a first integrator integrating an output signal of the summer and outputting a first integration signal; a second integrator integrating the first integration signal and outputting a second integration signal; a zero-optimizer adjusting a transfer function of the second integrator on the basis of positions of a plurality of zeros; a comparator comparing the second integration signal and a reference signal and outputting a digital signal according to the comparison result; and a digital-to analog converter converting the digital signal into an analog signal in response to a clock signal and outputting the analog signal; wherein the second integrator operates based on an Nth order (where N is a natural number of 1 or greater) transfer function and the zero-optimizer comprises the plurality of zeros corresponding to an order of the second integrator.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
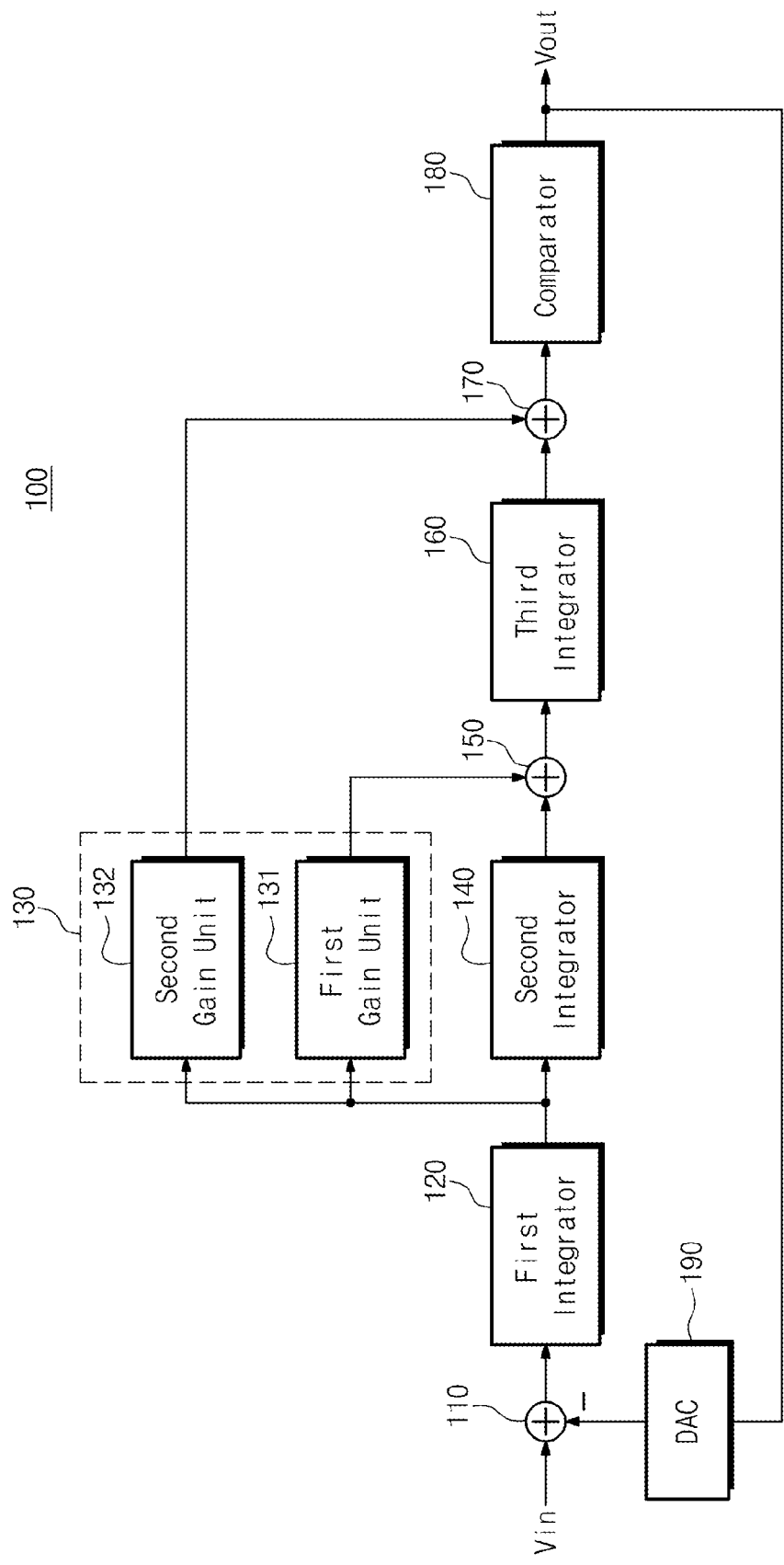
FIG. 1 is a block diagram illustrating a typical delta-sigma modulator.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the description of the drawings, like reference numerals are used to denote like constituent elements. A delta-sigma modulator to be described below and an operation performed thereby are just preferable examples for the purpose of illustrations only, not intended to limit the scope of the present invention, so it should be understood that other equivalents and modifications could be made thereto without departing from the spirit and scope of the present invention.

Hereinafter, it will be described about an exemplary embodiment of the present invention in conjunction with the accompanying drawings.

In the description of the present invention, a delta-sigma modulator may be implemented in a continuous-time scheme and have a negative feedback structure that an output of a comparator is connected to a first summer. In addition, in the description of the present invention, a delta-sigma modulator may be explained as a 3rd-order delta-sigma modulator, but is not limited thereto and may be implemented in a various order.

FIG. 1 is a block diagram illustrating a typical delta-sigma modulator. Referring to FIG. 1, a delta-sigma modulator 100 includes first to third summers 110, 150, and 170, first to third integrators 120, 140, and 160, a gain converting unit 130, a comparator 180, and a DAC 190. The sigma-delta modulator 100 shown in FIG. 1 operates based on a feed forward scheme and has the smaller number of DACs compared to the number of integrators.

The first summer 110 receives an analog input signal Vin input externally and an output signal of the DAC 190. The first summer 110 delivers, to the first integrator 120, a first sum signal that the output signal of the DAC 190 is subtracted from the received input signal Vin.

The first integrator 120 receives the first sum signal from the first summer 110, and generates a first integration signal by integrating the received first sum signal. The first integrator 120 may reduce a quantization error of a digital signal output from the comparator 180 through an integration operation. The first integrator 120 delivers the first integration signal to first and second gains units 131 and 132, and the second integrator 140.

The gain converting unit 130 may multiply the first integration signal output from the first integrator 120 by first and second forward coefficients and output the multiplied result. In detail, the gain converting unit 130 includes first and second gain units 131 and 132. The first gain unit 131 may deliver a first gain signal that the first integration signal is multiplied by a preset first forward coefficient to the second summer 150. The second gain unit 132 may deliver a second gain signal that the first integrating signal is multiplied by a preset second forward coefficient to the third summer 170.

The second integrator 140 integrates the first integration signal to generate a second integration signal, and delivers the generated second integration signal to the second summer 150. That is, the second integrator 140 further integrates the first integration signal and further reduces the quantization error of the digital signal output from the comparator 180.

The second summer 150 generates a second sum signal by summing the second integration signal and the first gain signal. The second summer 150 delivers the generated second sum signal to the third integrator 160.

The third integrator 160 generates a third integration signal by integrating the second sum signal and delivers the generated third integration signal to the third summer 170. Similarly, the third integrator 160 may further reduce the quantization error of the digital signal output from the comparator 180 by further integrating the second integration signal.

The third summer 170 generates a third sum signal by summing the third integration signal and the second gain signal, and delivers the generated third sum signal to the comparator 180.

The comparator 180 compares the received third integration signal with a reference signal according to resolution to output an N bit digital signal Vout. For example, the comparator 180 may output a 1 bit digital signal Vout. The 1 bit comparator may determine a high or low signal by comparing the third sum signal with 0. The comparator 180 delivers the output digital signal Vout to the DAC 190.

The DAC 190 receives the digital signal Vout and converts the received digital signal Vout into an analog signal in response to an external clock signal. The DAC 190 delivers the converted analog signal to the first summer 110. The delta-sigma modulator 100 may be a negative feedback structure that subtracts a signal output from the DAC 190 from the input signal Vin through the first summer 110.

As described above, the 3rd-order delta-sigma modulator 100 shown in FIG. 1 may operate as a DAC through coefficient conversion based on forward coefficients of the gain converting unit 130. However, the delta-sigma modulator 100 requires the number of integrators to correspond to the order and accordingly the circuit becomes complex. For example, when the delta-signal modulator 100 is implemented in a 3rd-order, three integrators are necessary.

Figure 2:
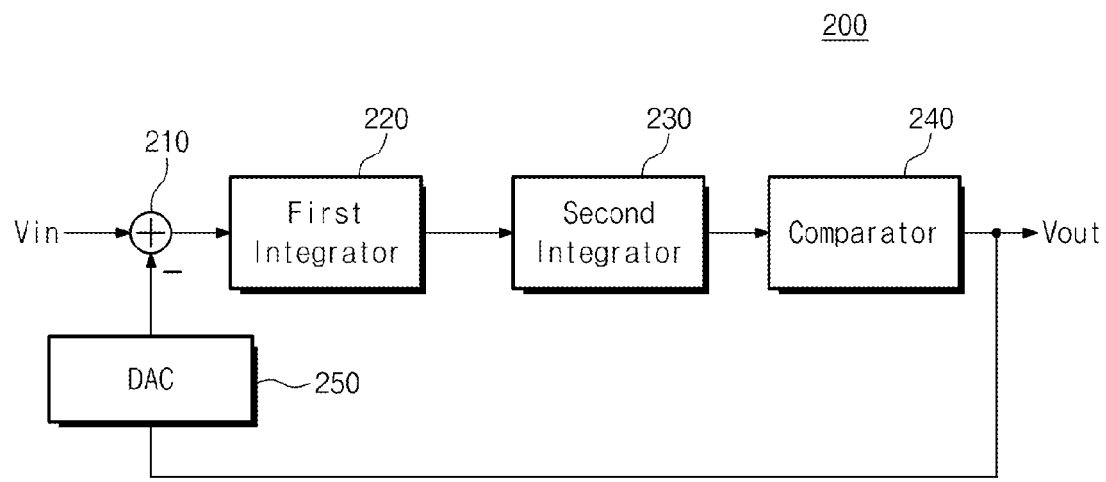
FIG. 2 is a circuit diagram illustrating a delta-sigma modulator according to an embodiment of the present invention.

FIG. 2 is a circuit diagram illustrating a delta-sigma modulator according to an embodiment of the present invention. Referring to FIGS. 1 and 2, the delta-sigma modulator 200 includes a summer 210, a first integrator 220, a second integrator 230, a comparator 240, and a DAC 250. In the description of the present invention, the delta-sigma modulator 200 may be implemented in a 3rd-order delta-sigma modulator, but is not limited thereto and may be implemented in various orders.

Compared to the delta-sigma modulator 100 shown in FIG. 1, the delta-sigma modulator 200 according to the present invention may include the second integrator 230 having a single input, single output (SISO) structure. The second integrator 230 may replace the gain converter 130, the second and third summers 150 and 170, and the second and third integrators 140 and 160 based on an Nth order transfer function. That is, the second integrator 230 may have an Nth transfer function through the coefficient conversion of elements of FIG. 1.

For example, for the transfer function of the second integrator 230, the second integrator 230 may be implemented with a 2nd-order transfer function based on transfer functions of the second and third integrators 140 and 160 shown in FIG. 1. It is assumed that, as shown in FIG. 1, the first forward coefficient of the first gain unit 131 included in the gain converting unit 130 is C1, and the second forward coefficient of the second gain unit 132 is C2. In addition, it is also assumed that a transfer function according to the second integrator 140 is A/s, and a transfer function according to the third integrator 160 is B/s.

$$\frac{K1S^2 + K2S + K3}{S^2} \quad (1)$$

The second integrator 230 according to the present invention may have a $2^{nd}$-order transfer function based on the Equation (1) through the coefficient conversion. Here, a coefficient K1 may be C2, which is a second forward coefficient. A coefficient K2 may be multiplication of B, which is a transfer function coefficient of the third integrator 160, and C1 which is a first forward coefficient. In addition, a coefficient K3 is multiplication of A, which is a transfer function coefficient of the second integrator 140, and B which is a transfer function of the third integrator 160.

Through the above-described conversion process, the delta-sigma modulator 200 according to the present invention may operate with two integrators, which is different from an existing 3rd-order delta-sigma modulator scheme requiring three integrators. Furthermore, as the number of the integrators becomes smaller, power consumption of an entire circuit may be reduced and a circuit becomes simple.

In the description of the present invention, a 3rd-order delta-sigma modulator is exemplified but the present invention is not limited thereto. That is, a 4th-order delta-sigma modulator may operate with two integrators. Here, the transfer function of the second integrator may be implemented in a 3rd-order transfer function according to three integrators.

For an operation of the delta-sigma modulator 200, the summer 210 delivers a sum signal that an output signal of the DAC 250 is subtracted from the input signal Vin to the first integrator 220.

The first integrator 220 receives a first sum signal from the first summer 210 and generates a first integration signal by integrating the received first sum signal. The first integrator 220 may reduces the quantization error of the digital signal output from the comparator 180.

The second integrator 230 integrates the first integration signal to generate a second integration signal, and delivers the generated second integration signal to the comparator 250. That is, the second integrator 230 further integrates the first integration signal and reduces the quantization error of the digital signal output from the comparator 250.

The comparator 240 compares the received second integration signal and a reference signal according to resolution, and outputs an N bit digital signal Vout.

The DAC 250 receives the digital signal Vout and converts the received digital signal Vout into an analog signal in response to an external clock signal. The analog signal is delivered to the summer 210. Similarly to the delta-sigma modulator 100 shown in FIG. 1, the delta-sigma modulator 200 may have a negative feedback structure that subtracts an output signal of the DAC 250 from the input signal Vin.

As described above, the delta-sigma modulator 200 includes a single integrator having a SISO structure, and accordingly a circuit structure thereof may become simpler and power consumption thereof becomes reduced.

Figure 3:
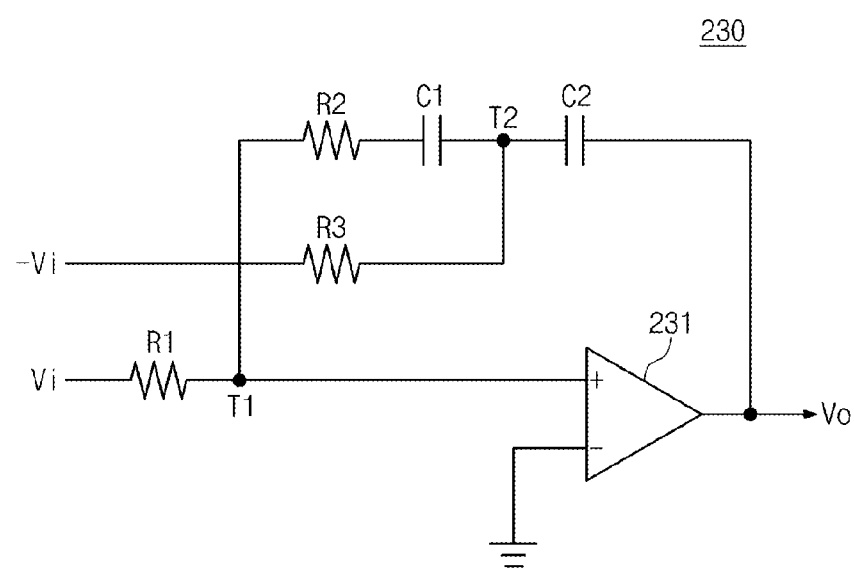
FIG. 3 is a circuit diagram illustrating a second integrator of FIG. 2.

FIG. 3 is a circuit diagram illustrating the second integrator shown in FIG. 2. As described in relation to FIG. 2, in order to implement an integrator having a SISO structure, a 2rd-order integrator is necessary to be implemented according to a 2rd-order transfer function.

Referring to FIG. 3, the second integrator 230 may output a second integration signal Vo based on the 2rd-order transfer function in response to positive and negative signals Vi and −Vi of the first integration signal output from the first integrator 220 (See FIG. 2). For example, each of the first and second integration signals may be output as positive and negative signals according to a differential amplification structure.

In detail, the second integrator 230 includes first to third resistors R1, R2, and R3, first and second capacitors C1 and C2, and an amplifier 231.

The first resistor R1 is positioned between a positive signal terminal of the first integration signal and a first node T1. The second resistor R2 and the first capacitor C1 are serially connected and positioned between the first and second nodes T1 and T2. In addition, the second capacitor C2 is positioned between an output terminal of the amplifier 231 and the second node T2.

The amplifier 231 may compare amplitudes of a voltage signal of the first node T1 and a ground voltage received from the ground terminal, and output the second integration signal Vo by amplifying the comparison result. That is, the amplifier 231 may transfer an input signal Vi to an output Vo with respect to the transfer function of Equation (2). In an embodiment, the amplifier 231 may be implemented with a differential amplifier.

$$\frac{V_o}{V_1} = -\frac{s^2 \cdot \left(\frac{R_1}{R_3}\right) + s \cdot \left(\frac{C_1 R_1 + C_2 R_2 + C_1 R_2 - C_1 R_3}{C_1 C_2 R_2 R_3}\right) + \frac{1}{C_1 C_2 R_2 R_3}}{S^2} \quad (2)$$

2nd-order transfer function characteristics of the second integrator 230 may be determined based on Equation (2). As described-above, the delta-sigma modulator 200 may reduce the number of integrators according to the 3rd-order delta-sigma modulator due to the second integrator 230 operated based on the 2nd-order transfer function. In addition, the second integrator 230 is described based on the 2nd-order transfer function, but is not limited thereto. The transfer function may be changed according to the order of the second integrator 230.

Figure 4:
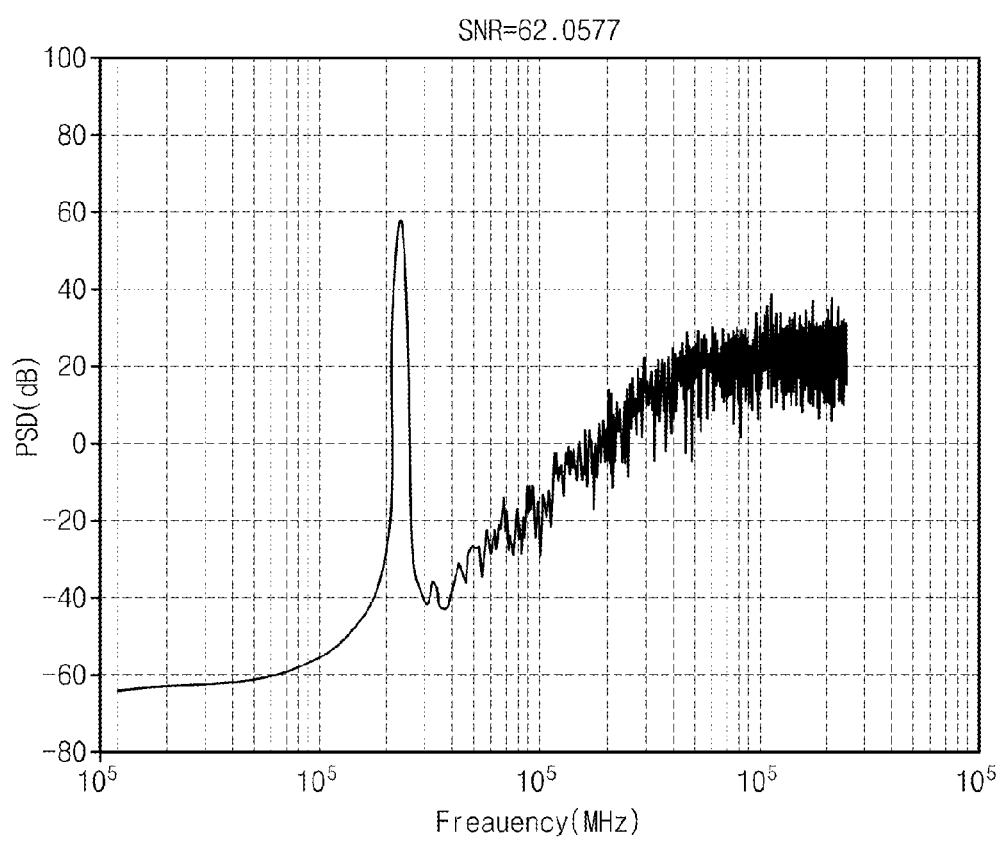
FIG. 4 is a graph showing SNR output characteristics of the delta-sigma modulator shown in FIG. 2.

FIG. 4 is a graph showing SNR output characteristics of the delta-sigma modulator shown in FIG. 2. A horizontal axis denotes a frequency and a vertical axis denotes a decibel (dB). Referring to FIG. 4, a SNR according to output characteristics of the delta-sigma modulator 200 (see FIG. 2) is about 62 dB, and it can be known that an SNR is obtained within a predetermined range, compared to the delta-sigma modulator 100 (see FIG. 1) shown in FIG. 1.

As described above, the delta-sigma modulator 200 may obtain SNR characteristics according to low power operation by including an integrator according to an Nth transfer function.

Figure 5:
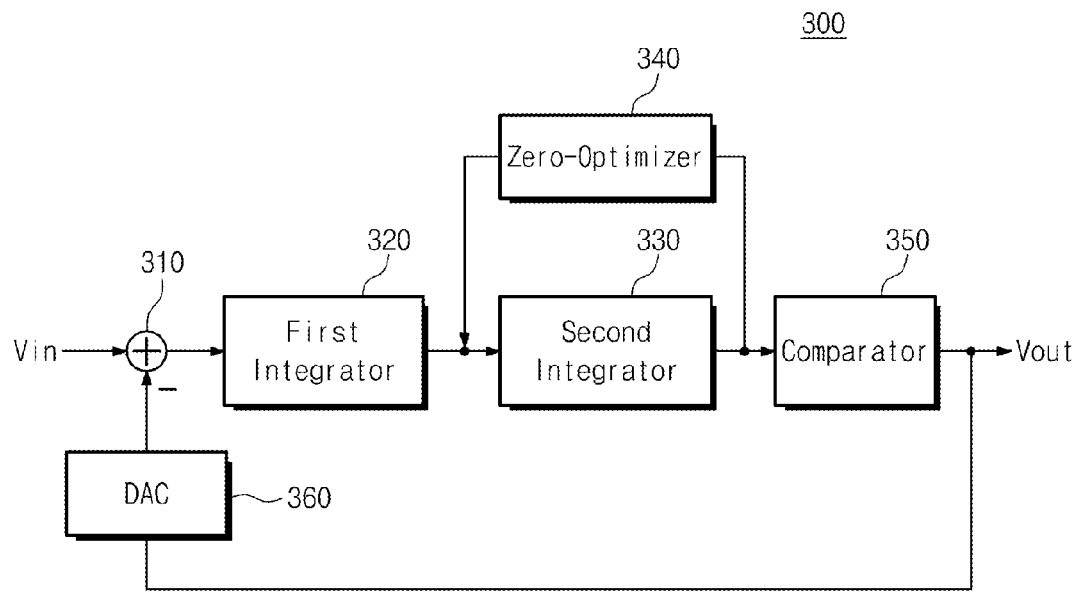
FIG. 5 is a block diagram illustrating a delta-sigma modulator according to another embodiment of the present invention.

FIG. 5 is a block diagram illustrating a delta-sigma modulator according to another embodiment of the present invention. Referring to FIG. 5, a delta-sigma modulator 300 includes a first summer 310, first and second integrators 320 and 340, a second summer 330, a zero-optimizer 350, a comparator 360, and a DAC 370.

That is, the delta-sigma modulator 300 further includes the zero-optimizer 350, compared to the delta-sigma modulator 200 shown in FIG. 2. Operation characteristics of the delta-sigma modulator 200 and the delta-sigma modulator 300 except the zero-optimizer 200 may be identical.

In an embodiment, as the second integrator 340 is implemented with the 2nd-order transfer function, the delta-sigma modulator 300 may increase SNR characteristics by adding the zero-optimizer 350. The zero-optimizer 350 may adjust arrangement of zeros and poles to fixed values and variable values, respectively, in response to the second integration signal output from the second integrator 330.

For example, the zero-optimizer 350 may include two zeros on the basis of the 2nd-order transfer function. The zero-optimizer 350 may reduce noise according to output characteristics by positioning one zero at an original point and setting a position of the other zero. As the order of the transfer function according to an order of the integrator is increased, the number of zeros may be increased. Typically, as the number of zeros is increased, noise according to SNR output characteristics can be further reduced.

Figure 6:
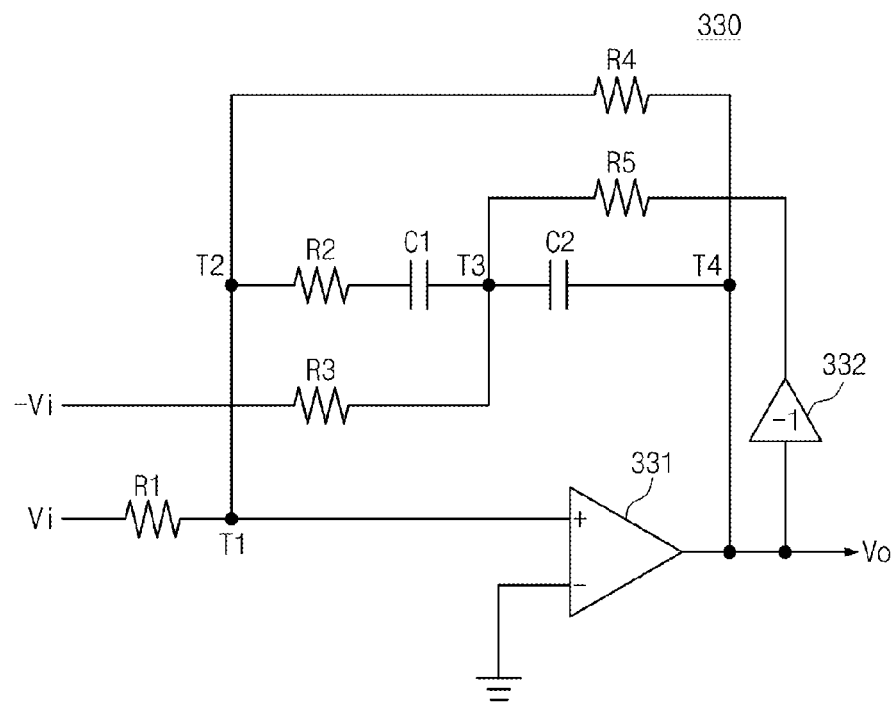
FIG. 6 is a block diagram illustrating a second integrator connected to the zero-optimizer in FIG. 5.

FIG. 6 is a circuit diagram illustrating a second integrator to which the zero-optimizer of FIG. 5 is connected. Referring to FIGS. 5 and 6, the second integrator 330 may output the second integration signal Vo based on the 2nd-order transfer function in response to positive and negative signals Vi and −Vi of the first integration signal output from the first integrator 320. Similarly, the second integration signal Vo may be output as positive and negative signals Vo and −Vo.

In detail, compared to the second integrator 230 shown in FIG. 3, the second integrator 330 further includes fourth and fifth resistors and an inverter 332 having a connection structure of the zero-optimizer 350.

The first resistor R1 positioned between a terminal of a positive signal Vi of the first integration signal and a first node T1. The second resistance R2 and the first capacitor C1 are serially connected and positioned between the second and third nodes T2 and T3. The third resistor R3 is positioned between a terminal of a negative signal −Vi of the first integration signal and the third node T3. The second capacitor C2 is positioned between the third node T3 and a fourth node T4.

The amplifier 331 may receive a voltage signal of the first node T1 and amplify a difference between magnitudes of the received voltage signal of the first node T1 and the ground voltage. That is, the amplifier 331 may transfer an input signal Vi to an output Vo with respect to the transfer function of Equation (3). In an embodiment, the amplifier 331 may be implemented with a differential amplifier.

The zero-optimizer 350 for improving SNR characteristics may include fourth and fifth resistors. The zero-optimizer 350 may be electrically connected to the second integrator 330. In detail, the fourth resistor R4 is positioned between the second node T2 and a fourth node, and the fourth node may be electrically connected to an output terminal of the amplifier 331. The fifth resistor R5 is serially connected to the inverter 332, and positioned between the third node T3 and an output terminal of the amplifier 331. For example, the inverter 332 may operate in response to a negative signal −Vo of the second integration signal output from the amplifier 331.

$$\frac{Vo}{Vi} = -\frac{K1*S^2 + K2*S + K3}{S^2 + K4*S + K5} \quad (3)$$

Referring to Equation (3), a transfer function (Vo/Vi) of the second integrator 330 may be obtained. In addition, first to fifth coefficients (K1, K2, K3, K4, and K5) shown in Equation (3) may be obtained through Equations 4 to 7.

$$K1 = \frac{C1C2R1R2R4R5}{C1C2R1R2R3R5 + C1C2R2R3R4R5} \quad (4)$$

First, a first coefficient K1 shown in equation (3) may be obtained through Equation 4.

$$K2 = \frac{(C1R2R3R4 + C1R1R4R5 + C2R2R4R5 + C1R1R2R4 - C1R3R4R5)}{C1C2R1R2R3R5 + C1C2R2R3R4R5} \quad (5)$$

Furthermore, a second coefficient K2 shown in equation (3) may be obtained through Equation (5).

$$K3 = \frac{(R4R5 + R2R4)}{C1C2R1R2R3R5 + C1C2R2R3R4R5} \quad (6)$$

In addition, a third coefficient K3 shown in equation (3) may be obtained through Equation (6).

$$K4 = \frac{(C1R2R3R5 + C1R1R3R5 + C2R2R3R5 + C1R1R2R3 - C1R2R3R4)}{C1C2R1R2R3R5 + C1C2R2R3R4R5} \quad (7)$$

In addition, a fourth coefficient K4 shown in equation (3) may be obtained through Equation (7).

$$K5 = \frac{(R3R5 + R2R3)}{C1C2R1R2R3R5 + C1C2R2R3R4R5} \quad (8)$$

Finally, a fifth coefficient K5 shown in equation (3) may be obtained through Equation (8).

As described above, the transfer function characteristics according to an operation of the second integrator 330 may be obtained based on Equation (2). In particular, noise according to an output of the second integrator 330 may be improved by a structure of the zero-optimizer 350, namely, the fourth and fifth resistors, which are electrically connected to the second integrator 330.

Figure 7:
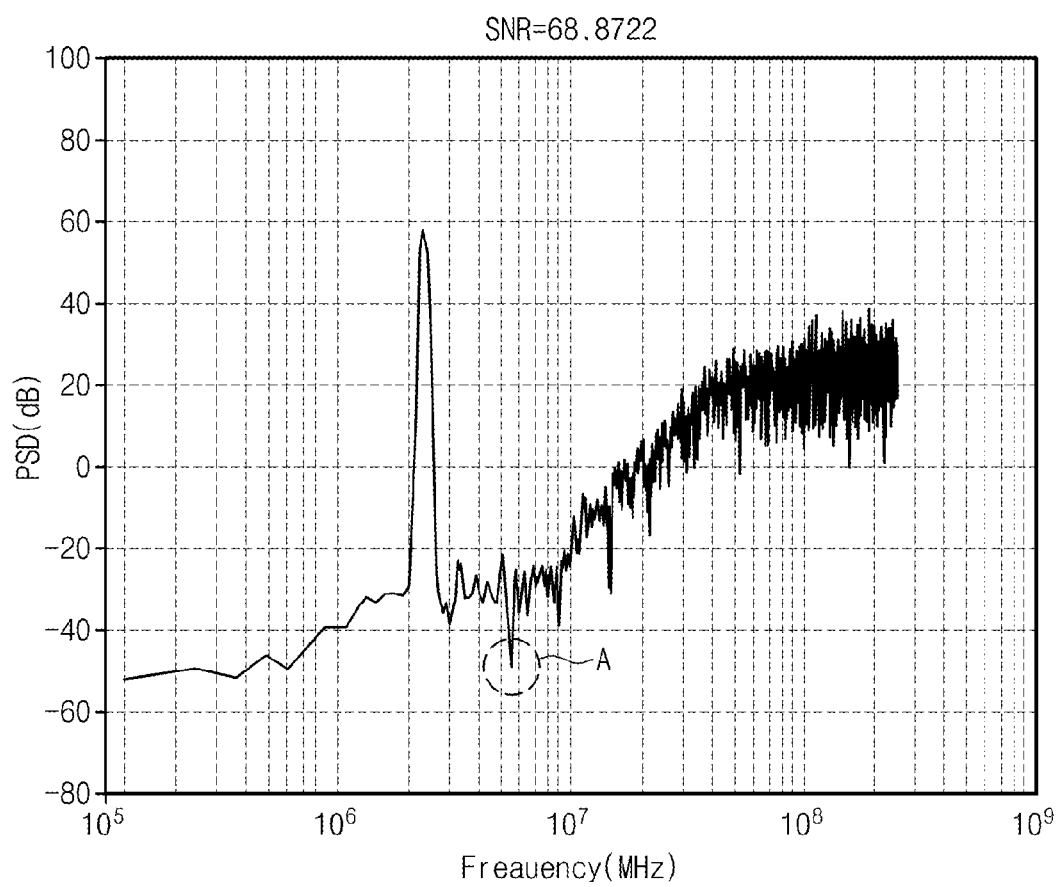
FIG. 7 is a graph showing SNR characteristics of the delta-sigma modulator in FIG. 5.

FIG. 7 is a graph showing SNR output characteristics of a delta-sigma modulator shown in FIG. 5. A horizontal axis denotes a frequency and a vertical axis denotes a decibel (dB).

Referring to FIGS. 5 and 7, the delta-sigma modulator 300 is implemented with a 3rd-order delta-sigma modulator, and includes a zero-optimizer 350 (see FIG. 5) connected to the second integrator 330. The delta-sigma modulator 300 may increase SNR characteristics compared to the delta-sigma modulator 200 shown in FIG. 2 according to operation characteristics of the zero-optimizer 350.

For example, the delta-sigma modulator 300 may include three zeros and three poles by including the zero-optimizer 350. In particular, two zeros are positioned at an original point, and the remnant one zero may be positioned at a pointer A. In response to the zero-optimizer 350, one zero is positioned at the pointer A and accordingly SNR noise characteristics may be reduced. Here, the zero position according to the zero-optimizer 350 is described as the pointer A, but is not limited thereto.

As described above, the delta-sigma modulator 300 can change the noise transfer function of the system through a position change of the zero point according to the zero-optimizer 350.

According to the embodiments of the present invention, a delta-sigma modulator can operate as a predetermined integrator and a digital-to analog converter in correspondence to an increase of an order thereof. Accordingly, power consumption can be reduced according to an operation of the delta-sigma modulator.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A delta-sigma modulator comprising:
   a summer summing an input signal and an analog signal;
   a first integrator integrating an output signal from the summer and outputting a first integration signal;
   a second integrator integrating the first integration signal and outputting a second integration signal;

a comparator comparing the second integration signal and a reference signal and outputting a digital signal according to the comparison result; and a digital-to-analog converter converting the digital signal into an analog signal in response to a clock signal and outputting the converted analog signal, wherein the second integrator operates based on an Nth order (where N is natural number of 1 or greater) transfer function, and wherein, when the second integrator operates based on a 2nd-order transfer function, the second integrator comprises:

a first resistor positioned between a positive signal terminal of the first integration signal and a first node;

a second resistor and a first capacitor serially connected between the first node and a second node;

a third resistor positioned between a negative signal terminal of the first integration signal and the second node;

an amplifier comparing magnitudes between a voltage signal from the first node and a ground signal and outputting the compared result; and a second capacitor is positioned between the second node and the amplifier.

2. The delta-sigma modulator of claim 1, wherein the digital signal output from the comparator is delivered to the summer through the digital-to-analog converter as a negative feedback structure.

3. The delta-sigma modulator of claim 1, wherein each of the first and second integration signals comprises positive and negative signals.

4. The delta-sigma modulator of claim 1, wherein the amplifier is a differential operational amplifier.

5. The delta-sigma modulator of claim 1, wherein the summer, the first and second integrators, the comparator, and the digital-analog converter are implemented in a continuous-time system.

6. A delta-sigma modulator comprising:

a summer summing an input signal and an analog signal;

a first integrator integrating an output signal of the summer and outputting a first integration signal;

a second integrator integrating the first integration signal and outputting a second integration signal;

a zero-optimizer adjusting a transfer function of the second integrator on the basis of positions of a plurality of zeros;

a comparator comparing the second integration signal and a reference signal and outputting a digital signal according to the comparison result; and a digital-to analog converter converting the digital signal into an analog signal in response to a clock signal and outputting the analog signal;

wherein the second integrator operates based on an Nth order (where N is a natural number of 1 or greater) transfer function and the zero-optimizer comprises the plurality of zeros corresponding to an order of the second integrator.

7. The delta-sigma modulator of claim 6, wherein each of the first and second integration signals comprises negative and positive signals.

8. The delta-sigma modulator of claim 7, wherein, when the second integrator operates based on a 2nd-order transfer function, the second integrator comprises:

a first resistor positioned between a positive signal terminal of the first integration signal and a first node;

a second resistor and a first capacitor serially connected between a second node and a third node, wherein the first node and second node are serially connected;

a third resistor positioned between a negative signal terminal of the first integration signal and the third node;

an amplifier comparing magnitudes between a voltage signal of the first node and a ground signal and outputting the compared result; and a second capacitor positioned between the third node and a fourth node, wherein the fourth node and an output terminal of the amplifier are electrically connected, a fourth resistor is positioned between the second and fourth nodes, and a fifth resistor positioned between the third node and the amplifier on the basis of the plurality of zeros.

9. The delta-sigma modulator of claim 8, further comprising an inverter serially connected to the fifth resistor on the basis of the negative signal of the second integration signal.

\* \* \* \* \*